United States Patent [19]

Fandrich et al.

[11] Patent Number: 5,513,136

[45] Date of Patent: Apr. 30, 1996

[54] NONVOLATILE MEMORY WITH BLOCKS AND CIRCUITRY FOR SELECTIVELY PROTECTING THE BLOCKS FOR MEMORY OPERATIONS

[75] Inventors: Mickey L. Fandrich, Placerville; Virgil N. Kynett, El Dorado Hills; Salim B. Fedel, Folsom; Thomas C. Price, Fair Oaks, all of Calif.

[73] Assignee: Intel Corporation, Santa Clara, Calif.

[21] Appl. No.: 358,978

[22] Filed: Dec. 19, 1994

Related U.S. Application Data

[63] Continuation of Ser. No. 127,776, Sep. 27, 1993, abandoned.

[51] Int. Cl.$^6$ .................................................. G11C 16/06
[52] U.S. Cl. ........................ 365/185.04; 365/185.09; 365/185.11; 365/185.22; 365/188.05; 365/195; 365/196; 365/230.08
[58] Field of Search ........................... 365/185, 230.02, 365/230.03, 189.02, 230.08, 218, 195, 196, 185.04, 185.09, 185.11, 185.22, 189.05

[56] References Cited

U.S. PATENT DOCUMENTS

| | | |
|---|---|---|
| 4,228,528 | 10/1988 | Cenker et al. . |
| 4,358,833 | 11/1982 | Folmsbee et al. . |
| 4,538,245 | 8/1985 | Smarandoiu et al. . |
| 4,811,293 | 3/1989 | Knothe et al. ............... 365/230.03 |
| 4,811,294 | 3/1989 | Kobayashi et al. . |
| 4,931,997 | 6/1990 | Mitsuishi et al. ............... 365/218 |
| 4,961,172 | 10/1990 | Shubat et al. ............... 365/189.02 |
| 5,014,191 | 5/1991 | Padgaonkar et al. . |
| 5,034,922 | 7/1991 | Burgess . |
| 5,046,046 | 9/1991 | Sweha et al. . |
| 5,065,364 | 11/1991 | Atwood et al. . |
| 5,175,840 | 12/1992 | Sawase et al. ............... 365/195 |
| 5,197,034 | 3/1993 | Fandrich et al. . |
| 5,216,633 | 6/1993 | Weon et al. ............... 365/195 |
| 5,222,046 | 6/1993 | Kreifels et al. . |
| 5,224,070 | 6/1993 | Fandrich et al. . |
| 5,233,559 | 8/1993 | Brennan, Jr. . |
| 5,239,505 | 8/1993 | Fazio et al. . |
| 5,245,572 | 9/1993 | Kosonocky et al. ............... 365/189.02 |
| 5,249,158 | 9/1983 | Kynett et al. . |
| 5,278,786 | 1/1994 | Kawauchi et al. ............... 365/185 |
| 5,280,449 | 1/1994 | Oldham ............... 365/230.02 |
| 5,287,310 | 2/1994 | Schreck et al. ............... 365/230.03 |
| 5,293,344 | 3/1994 | Akaogi ............... 365/185 |
| 5,293,610 | 3/1994 | Schwarz ............... 365/195 |
| 5,325,499 | 6/1994 | Kummer et al. ............... 365/195 |
| 5,327,380 | 7/1994 | Kersh et al. ............... 365/200 |
| 5,327,383 | 7/1994 | Merchant et al. . |
| 5,333,300 | 7/1994 | Fandrich . |
| 5,369,647 | 11/1994 | Kreifels et al. . |

*Primary Examiner*—Joseph E. Clawson, Jr.
*Attorney, Agent, or Firm*—Blakely, Sokoloff Taylor & Zafman

[57] ABSTRACT

A nonvolatile memory comprises a memory array and a control circuit coupled to the memory array for performing memory operations with respect to the memory array. A storage circuit associated with the memory array is provided for storing a data. When the data is stored in the storage circuit, the memory array is locked from being accessed for the memory operations. A logic circuit is coupled to the control circuit and the storage circuit for preventing the control circuit from accessing the memory array with respect to the memory operations in accordance with the data. The logic circuit prevents the control circuit from accessing the memory array when the storage circuit stores the data. A control input is provided for receiving a control signal. The control signal is applied to the logic circuit and can be in a first voltage state and a second voltage state. When the control signal is in the first voltage state, the logic circuit is enabled to lock the memory array with respect to the memory operations in accordance with the data stored in the storage circuit. When the control signal is in the second voltage state, the logic circuit is disabled to lock the memory array and the memory array is allowed for the memory operations regardless of the data stored in the storage circuit.

6 Claims, 4 Drawing Sheets

Figure 4

| $\overline{WP}$ | BS 1 | BL |
|---|---|---|
| 0 | 0 | 1 |
| 0 | 1 | 0 |
| 1 | 0 | 0 |
| 1 | 1 | 0 |

NONVOLATILE MEMORY WITH BLOCKS AND CIRCUITRY FOR SELECTIVELY PROTECTING THE BLOCKS FOR MEMORY OPERATIONS

This is a continuation of application Ser. No. 08/127,776, filed Sep. 27, 1993 now abandoned.

FIELD OF THE INVENTION

The present invention pertains to the field of computer memories. More particularly, this invention relates to a nonvolatile memory that includes memory blocks and circuitry for selectively protecting the blocks from memory operations.

BACKGROUND OF THE INVENTION

A prior flash erasable and electrically programmable read-only memory ("flash EPROM") is typically organized into rows and columns. Memory cells are placed at intersections of word lines and bit lines. Each word line is connected to the gate of a plurality of memory cells in one row. Each bit line is connected to the drain of a plurality of memory cells in one column. The sources of all the memory cells can be connected to a common source line. The prior flash EPROM can be programmed, and once programmed, the entire content of the prior flash EPROM can be erased by electrical erasure. A high erasing voltage $V_{PP}$ is made available to the source of all the cells simultaneously. This results in a full array erasure. The prior art flash EPROM may then be reprogrammed with new data.

One disadvantage of this prior flash EPROM structure is the characteristics of array erasure. When changes are sought to be made to a program stored in the array, the entire array must be erased and the entire program be rewritten into the array, even when the changes are minor.

One prior approach to solving this problem is to reorganize the array into blocks so that the high erasing voltage is made available only to the source of every cell within one block to be erased. In this arrangement, each block can be individually addressed for read, programming, and erasure operations.

One disadvantage associated with this memory configuration is that data stored in one memory block may be inadvertently erased during a programming or erasure operation of another memory block of the prior flash EPROM. The inadvertent programming or erasure in that memory block may occur when an error in an address for another memory block directs the operation to a memory location in that memory block. The inadvertent operation in that memory block then causes damage to the data integrity in that memory block. Typically, some of the memory blocks in the flash EPROM store data that requires less amount of data update than data stored in other memory blocks. Therefore, a mechanism is required to lock individual memory blocks in the memory array temporarily from being programmed or erased.

SUMMARY AND OBJECTS Of THE INVENTION

One of the objects of the present invention is to provide a nonvolatile memory that allows its memory blocks to be selectively protected from being programmed and erased.

Another object of the present invention is to provide a nonvolatile memory that allows a block lock information for selectively protecting the memory blocks of the nonvolatile memory from undergoing the programming and erasure operations to be stored in the nonvolatile memory, wherein the block lock information can be updated.

Another object of the present invention is to provide a nonvolatile memory that allows the block lock information stored in the nonvolatile memory to be protected from being updated.

A further object of the present invention is to provide a nonvolatile memory that allows the block lock information stored in the nonvolatile memory to be disabled from selectively protecting the memory blocks of the nonvolatile memory from undergoing the programming and erasure operations.

A nonvolatile memory comprises a memory array and a control circuit coupled to the memory array for performing memory operations with respect to the memory array. A storage circuit associated with the memory array is provided for storing a data. When the data is stored in the storage circuit, the memory array is locked from being accessed for the memory operations. A logic circuit is coupled to the control circuit and the storage circuit for preventing the control circuit from accessing the memory array with respect to the memory operations in accordance with the data. The logic circuit prevents the control circuit from accessing the memory array when the storage circuit stores the data. A control input is provided for receiving a control signal. The control signal is applied to the logic circuit and can be in a first voltage state and a second voltage state. When the control signal is in the first voltage state, the logic circuit is enabled to lock the memory array with respect to the memory operations in accordance with the data stored in the storage circuit. When the control signal is in the second voltage state, the logic circuit is prevented from locking the memory array and the memory array is allowed for the memory operations regardless of the data stored in the storage circuit.

A nonvolatile memory comprises a memory array that further includes a first memory block and a second memory block. A control circuit is coupled to the first and second memory blocks for controlling memory operations with respect to the first and second memory blocks. A first storage circuit is provided that is associated with the first memory block for storing a first data. When the first data is stored in the first storage circuit, the first memory block is locked from being accessed for the memory operations. A second storage circuit is provided that is associated with the second memory block for storing a second data. When the second data is stored in the second storage circuit, the second memory block is locked from being accessed for the memory operations. A logic circuit is coupled to the control circuit and the first and second storage circuits for preventing the control circuit from accessing the first and second memory blocks with respect to the memory operations in accordance with the first and second data. The logic circuit prevents the control circuit from accessing the first memory block for the memory operations when the first storage circuit stores the first data. The logic circuit prevents the control circuit from accessing the second memory block for the memory operations when the second storage circuit stores the second data. A control input is provided for receiving a control signal. The control signal is applied to the logic circuit and can be in a first voltage state and a second voltage state. When the control signal is in the first voltage state, the logic circuit is enabled to lock the first and second memory blocks with respect to the memory operations in accordance with the first and second data stored in the first and second storage circuits. When the control signal is in the second voltage state, the logic circuit is prevented from locking the first and second memory blocks with respect to the memory operations regardless of the first and second data stored in the first and second storage circuits.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 4 is a logic table showing the relationship of the $\overline{WP}$, BS1, and BL signals illustrated in FIGS. 2–3.

DETAILED DESCRIPTION

Figure 1:
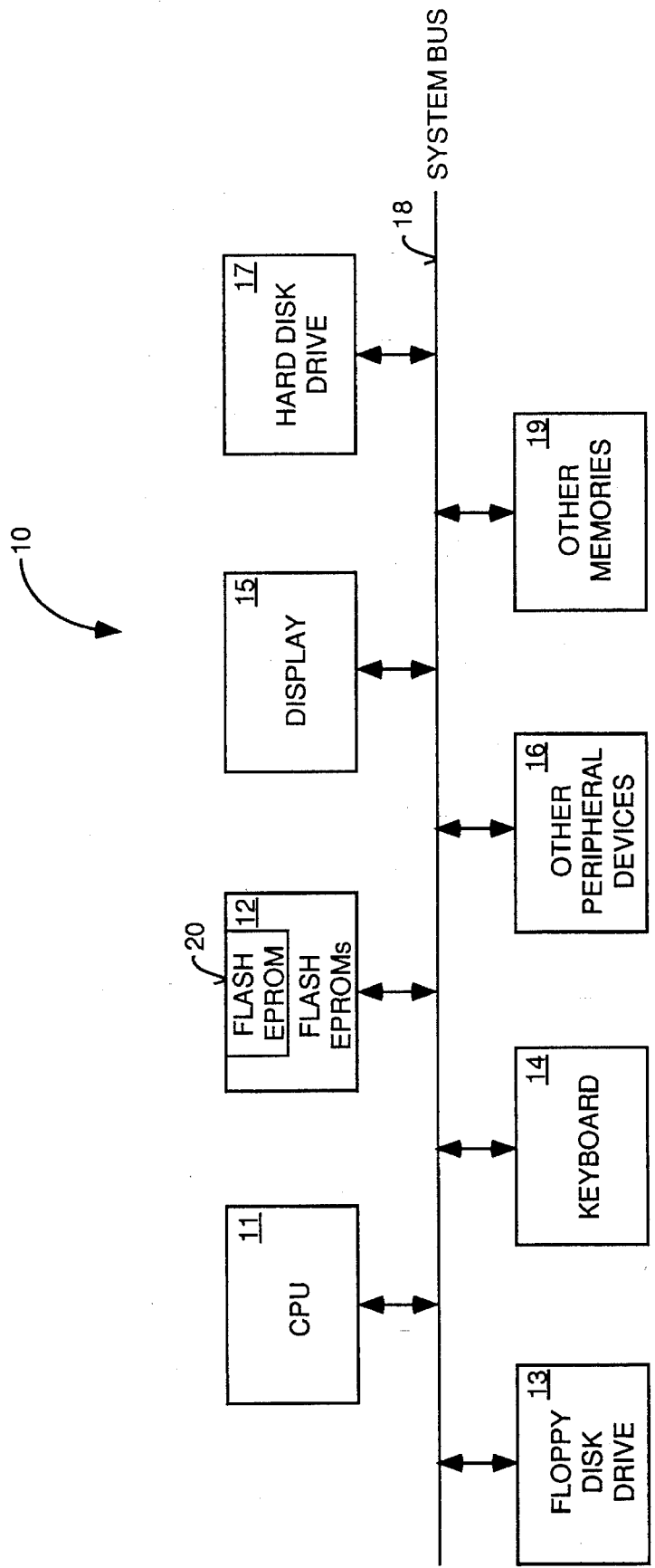
FIG. 1 is a block diagram of a computer system that includes a CPU and a flash EPROM.

FIG. 1 schematically illustrates the architecture of a computer system 10 that includes a flash EPROM 20 which implements an embodiment of the present invention.

Figure 2:
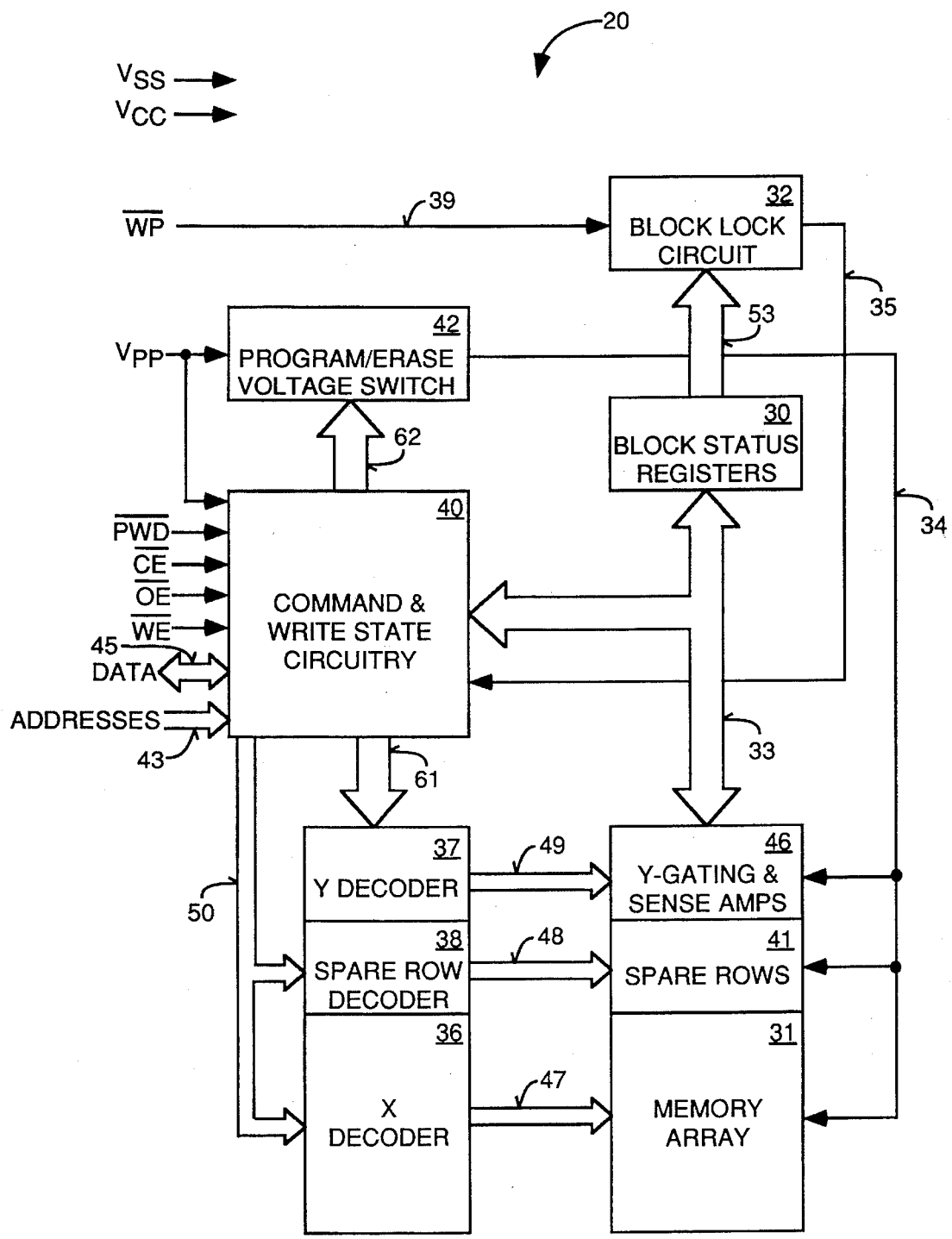
FIG. 2 is a block diagram of the flash EPROM that is used in the computer system of FIG. 1, wherein the flash EPROM includes spare rows of memory cells, a block status register, a block lock circuit, and a write protect $\overline{WP}$ input pin.

FIG. 2 illustrates the circuitry of flash EPROM 20, which is one of flash EPROMs 12 of FIG. 1. Flash EPROM 20 includes a memory array 31, command and write state circuitry 40 for controlling the memory operations of memory array 31, and a program/erase voltage switch 42 for applying a program/erase voltage $V_{PP}$ to memory array 31 and command and write state circuitry 40.

As will be described in more detail below, flash EPROM 20 has a plurality of memory blocks, each of which can be individually locked from the programming and erasure operations by the information stored in spare rows of memory cells 41 of flash EPROM 20.

Referring to FIG. 1, computer system 10 includes a central processing unit ("CPU 11") coupled to a system bus 18. For one embodiment, CPU 11 comprises an i486™ microprocessor sold by Intel Corporation of Santa Clara, California. Flash EPROMs 12 are also coupled to system bus 18. Flash EPROMs 12 include a plurality of separately packaged flash EPROMs, including flash EPROM 20. Computer system 10 also includes other memories 19 that are coupled to system bus 18. Other memories 19 may include random access memories ("RAMs"), read only memories ("ROMs"), EPROMs, or other type of memories.

Computer system 10 also includes a floppy disk drive 13, a keyboard 14, a display 15, and a hard disk drive 17 coupled to system bus 18.

Computer system 10 also includes other peripheral devices 16 that are connected to system bus 18. These other peripheral devices may include a modem, a serial communication controller, a local area network ("LAN"), and a parallel communication controller.

Referring to FIG. 2, memory array 31 of flash EPROM 20 is made up of memory cells that store data at addresses. For one embodiment, memory array 31 stores 16 Mbits ("megabits") of data. For another embodiment, memory array 31 stores 8 Mbits of data. For alternative embodiments, memory array 31 can be smaller than 8 Mbits or larger than 16 Mbits.

For one embodiment, memory array 31 is organized into bit line blocks by arranging bit lines into groups. The configuration of memory array 31 will be described in more detail below, in conjunction with FIG. 3.

For one embodiment, all the circuitry of flash EPROM 20 resides on a single substrate and flash EPROM 20 employs MOS circuitry.

Spare rows 41 are located peripheral to memory array 31. Spare rows 41 include a number of memory rows, each corresponding to one of the memory blocks of memory array 31. Spare rows 41 include flash EPROM cells. Spare rows 41 are used to store the information for locking and unlocking the individual memory blocks of memory array 31 (i.e., the block lock data). In addition, spare rows 41 also store other information with respect to flash EPROM 20. For example, spare rows 41 store the cycle count information of the respective blocks of flash EPROM 20, the information with respect to the defective memory blocks of memory array 31, and the information with respect to whether the data stored in spare rows 41 is valid or not.

For one embodiment, two rows of rows 41 are used for storing the information of one block of memory array 31. For another embodiment, each row of rows 41 is used for storing the information for one block of memory array 31. For alternative embodiments, more than two rows can be used for one block of memory array 31.

For one embodiment, the information for a particular block is comprised of 128 bytes of data. For another embodiment, the information stored in spare rows 41 for a particular block is comprised of 64 bytes of data. Depending on the array architecture of memory array 31, the information for a particular block may be more than 128 bytes of data or less than 64 bytes of data.

Spare rows 41 are not directly accessible by external circuitry (not shown), but are accessible by command and write state circuitry 40. During the memory operations for a particular block of memory array 31, command and write state circuitry 40 can inquire, with special commands, the information stored in spare rows 41 with respect to that particular block.

The external circuitry, however, can write information into spare rows 41 via command and write state circuitry 40. The external circuitry issues the special commands to command and write state circuitry 40. Command and write state circuitry 40 decodes the special commands and access spare rows 41 with the information to be stored in spare rows 41.

As described above, spare rows 41 store the block lock data for each of the memory blocks of memory array 31. As will be described below in more detail, when the block lock data of a particular block is stored in the corresponding row of spare rows 41, this block lock data can be read out to block status registers 30 in which the block lock data can be used to lock the associative memory block from being accessed for the programming and erasure operations. When a memory block of memory array 31 is locked from being accessed for the programming and erasure operations, its corresponding row or rows of spare rows 41 are also locked from being accessed from the programming and erasure operations. The locked memory block, however, can be accessed for a read operation. The read operation can also be applied to the row or rows of the spare rows 41 that are associated with the locked block.

For one embodiment, the block lock data for each block of memory array is a single bit data. For another embodiment, the block lock data for each block of memory array 31 is a multi-bit data.

Spare rows 41 also store a spare row data valid flag data for each of the memory blocks of memory array 31. The spare row data valid flag data for a memory block of memory array 31 is used to indicate if the data for that particular memory block stored in the corresponding row of spare rows 41 is valid or not. This means that even if the block lock data for a particular block is stored in the corresponding row of spare rows 41 for that particular block, this block lock data cannot be used to lock that particular block if the spare row data valid flag data for that particular block is not stored in the corresponding row of spare rows 41. Once the spare row data valid flag data for that particular block is stored in the corresponding row of spare rows 41, the block lock data stored in spare rows 41 for that particular block can then be used to lock that particular block.

Flash EPROM 20 also includes an X decoder 36, a spare row decoder 38, and a Y decoder 37. X decoder 36 is the row decoder for memory array 31 and spare row decoder 38 is the row decoder for spare rows 41. Y decoder 37 is the column decoder for memory array 31 and spare rows 41. X decoder 36 is coupled to the word lines of memory array 31. X decoder 36 receives X addresses from address bus 50 and selects one word line in accordance with each of the X addresses applied.

Spare row decoder 38 is coupled to the word lines of spare rows 41. Spare row decoder 38 receives block addresses of memory array 31 from address bus 50 and selects one spare row (i.e., one word line) in accordance with each of the block addresses applied.

Y decoder 37 is coupled to the bit lines of memory array 31 and spare rows 41 via Y gating and sense amplifiers 46. Y decoder 37 receives Y addresses from address bus 50. For one embodiment, Y decoder 37 selects one word of bit lines (i.e., 16 bit lines) from either spare rows 41 or memory array 31 for each Y address applied. During the programming operation, program/erase voltage switch 42 applies the $V_{PP}$ voltage to the selected bit lines through the Y gating of Y gating and sense amplifier 46. During the read operation, the sense amplifier of Y gating and sense amplifier 46 senses the data from the selected bit lines from memory array 31. The data is then applied to command and write state circuitry 40. When the read operation is directed to a selected one of spare rows 41, sense amplifier 46 senses the data from the selected bit lines of the selected one of spare rows 41. The data is then applied to block status registers 30 via bus 33.

Block status registers 30 include a number of multi-bit volatile registers, each for storing the data for a memory block of memory array 31. For example, when memory array 31 includes thirty-two (32) memory blocks, block status registers 30 will include thirty-two registers. Each of the thirty-two registers is responsible for storing the information of its respective memory block. The information of a block is supplied to the respective register of block status registers 30 from one of spare rows 41 that also corresponds to the memory block. Block status registers 30 can be accessed by command and write state circuitry 40. Command and write state circuitry 40 can read and write to block status registers 30 via special commands. When flash EPROM 20 is first powered on, block status registers 30 are reset to logical low state (i.e., logical zero). When required, command and write state circuitry 40 of flash EPROM 20 can update each of the registers of block status registers 30 with the data stored in the corresponding one of spare rows 41.

Command and write state circuitry 40 of flash EPROM 20 controls the memory operations with respect to memory array 31 and spare rows 41. The memory operations typically include read, programming, and erasure operations. Command and write state circuitry 40 includes write state circuitry and command state circuitry (both are not shown). Command and write state circuitry 40 also includes an input buffer (not shown) for buffering input data from data bus 45 and an output buffer (not shown) for buffering output data from memory array 31 to data bus 45. The write state circuitry of command and write state circuitry 40 regulates the memory operations of flash EPROM 20 after an initiating command from the external circuitry. The command is applied to the command state circuitry of command and write state circuitry 40. The command state circuitry decodes the command and generates the appropriate control signals to the write state circuitry.

As described above, command and write state circuitry 40 of flash EPROM 20 can also access spare rows 41 and block status registers 30 through the special commands. The special commands may include a spare row write command, a spare row read command, and a block status register read command. When the contents of spare rows 41 are allowed to be updated, the external circuitry can issue the spare row write command to write to the selected one of spare rows 41. The contents stored in spare rows 41 can be read to block status registers 30 by issuing the spare row read command to read the data stored in the selected one of spare rows 41 to block status registers 30. Spare rows 41, block status registers 30, and their functions will be described in more detail below.

$V_{PP}$ is the program/erase power supply voltage for flash EPROM 20. $V_{PP}$ is coupled to program/erase voltage switch 42 and command and write state circuitry 40. During programming and erasing of flash EPROM 20, program/erase voltage switch 42 passes the $V_{PP}$ potential to memory array 31 and spare rows 41. For one embodiment, $V_{PP}$ is approximately 12 volts.

$V_{CC}$ is the device power supply for flash EPROM 20 and $V_{SS}$ is ground. For one embodiment, $V_{CC}$ is approximately 3 volts. For another embodiment, $V_{CC}$ is approximately 5 volts.

Flash EPROM 20 includes three control signals coupled to command and write state circuitry 40 - namely, chip enable $\overline{CE}$, output enable $\overline{OE}$, and write enable $\overline{WE}$. Chip enable input $\overline{CE}$ is the device selection of flash EPROM 20. The output enable input $\overline{OE}$ is the output control for flash EPROM 20. The write enable signal $\overline{WE}$ allows writes to command and write state circuitry 40 while chip enable input $\overline{CE}$ is active low.

Flash EPROM 20 also includes a $\overline{PWD}$ control signal. The $\overline{PWD}$ control signal is an active low power down control signal. A logically low $\overline{PWD}$ control signal causes flash EPROM 20 to enter the power down mode. When the $\overline{PWD}$ control signal raises to the $V_{CC}$ voltage (i.e., logical high), flash EPROM 20 returns to its normal operational modes.

For alternative embodiments, flash EPROM 20 functions without some of the above-mentioned control signals.

Flash EPROM 20 also includes a block lock circuit 32 and a write protection pin $\overline{WP}$. Block lock circuit 32 is connected to block status registers 30 via bus 53. Block lock circuit 32 is also connected to command and write state circuitry 40 via line 35. Block lock circuit 32 is used in flash EPROM 20 to lock, when activated, command and write state circuitry 40 from performing the programming and erasure operations with respect to memory array 31 and spare rows 41. The circuit of block lock circuit 32 will be described in more detail below, in conjunction with FIG. 3.

The $\overline{WP}$ pin is coupled to block lock circuit 32. The $\overline{WP}$ pin supplies a $\overline{WP}$ control signal to block lock circuit 32. The $\overline{WP}$ control signal is an active low write protection control signal. The $\overline{WP}$ control signal is a master write protection control signal that controls block lock circuit 32 to generate the block lock signal to lock memory array 31 based on the block lock data stored in block status registers 30. A logical low $\overline{WP}$ signal causes block lock circuit 32 to lock command and write state circuitry 40 from performing the programming and erasure operations with respect to memory array 31 and spare row 41 in accordance with the block lock data stored in block status registers 30. If the block lock data for a particular block is stored in the corresponding one of block status registers 30, block lock circuit 32 is then enabled to lock command and write state circuitry 40 from performing the programming and erasure operations to that particular block of memory array 31. If not, that particular block is not locked for the programming and erasure operations even if the $\overline{WP}$ control signal is logically low. In other words, logical low $\overline{WP}$ control signal enables block lock circuit 32 to lock memory array 31 in accordance with the block lock data stored in spare rows 41.

A logical high $\overline{WP}$ signal causes block lock circuit 32 to ignore the block lock data, if any, stored in block status registers 30 and to unlock command and write state circuitry 40 and the programming and erasure operations can be performed with respect to memory array 31, regardless of the block lock data stored in block status registers 30 and spare rows 41. The logical high $\overline{WP}$ control signal also allows command and write state circuitry 40 to access spare rows 41 for the programming and erasure operations. In other words, the logical high $\overline{WP}$ control signal disables block lock circuit 32.

When spare rows 41 are permitted for the programming and erasure operations, command and write state circuitry 40 accesses the individual rows of spare rows 41 for the programming operation in order to write the information into spare rows 41. When a row of spare rows 41 corresponding to a particular block of memory array 31 needs an erasure operation, that particular block undergoes the erasure operation in which the data stored in the corresponding row of spare rows 41 for that particular block is also erased. In other words, each of spare rows 41 is treated as an extra row of its corresponding memory block of memory array 31.

Figure 3:
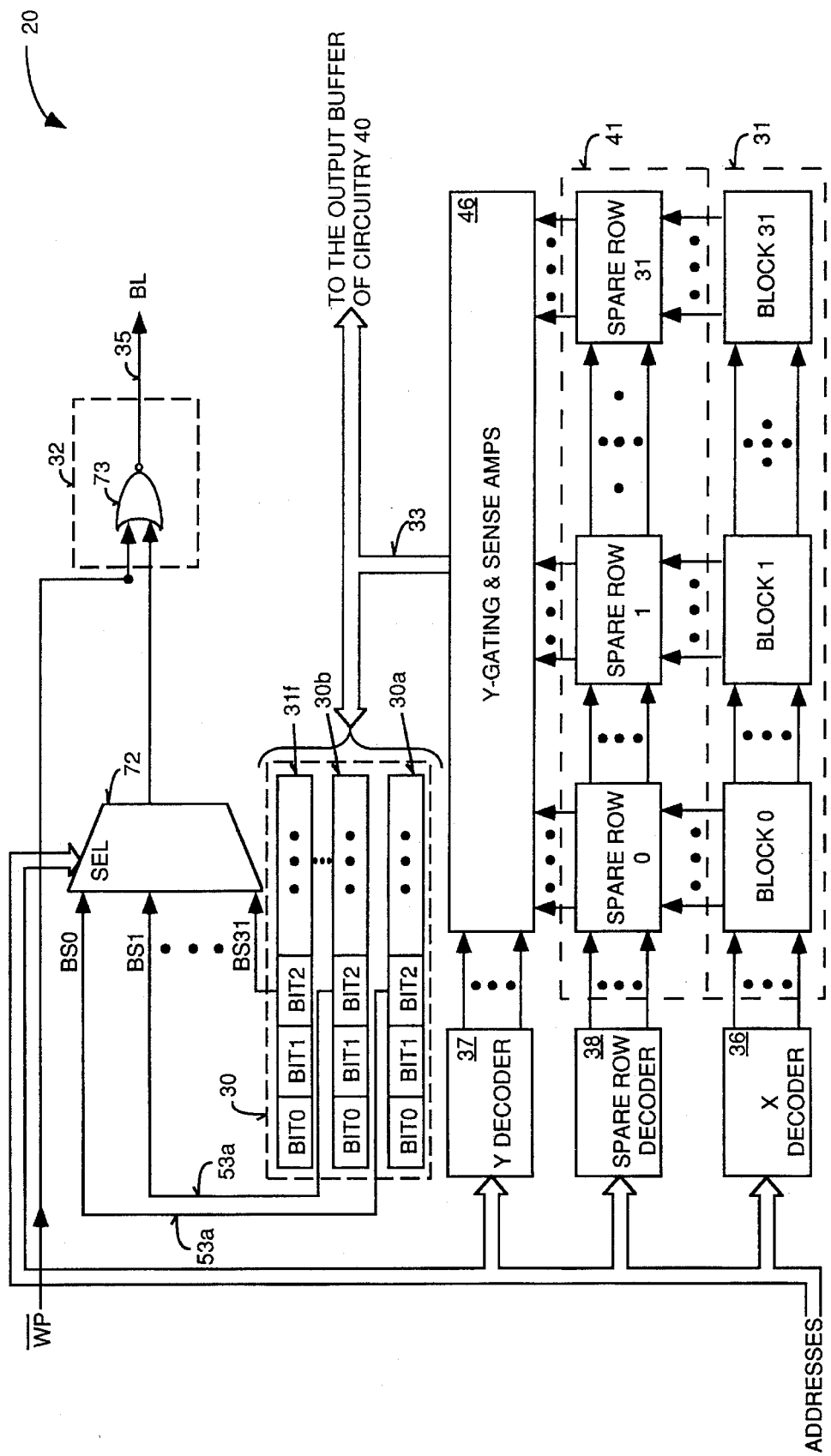
FIG. 3 is another block diagram of the flash EPROM illustrating the circuitry of the block status register and the block lock circuit.

Referring now to FIG. 3, flash EPROM 20 is shown in more detail with respect to block status registers 30 and block lock circuit 32. In addition, each block of memory array 31 is shown in FIG. 3 with its corresponding row of spare rows 41. As shown in FIG. 3, memory array 31 includes blocks BLOCK 0 through BLOCK 31. Spare rows 41 also include SPARE ROW 0 through SPARE ROW 31, each being associated with one of the blocks of memory array 31.

Block status registers 30 also include thirty-two registers 30a through 31f. Each of registers 30a–31f is also associated with one of spare rows 41 and is used to store the data read from its corresponding row of spare rows 41.

For one embodiment, each of registers 30a–31f can store eight bits of data at one time. For alternative embodiments, each of registers 30a–30f can store more or fewer than eight bits of data at one time. For one embodiment, BIT2 of each of registers 30a–31f stores the block lock data received from its corresponding one of spare rows 41. When the block lock data for a particular block stored in one of spare rows 41 is required to be supplied to the respective one of registers 30a–30f of block status registers 30, the data byte comprising the block lock data is read to the respective register of block status registers 30 from the respective one of spare rows 41. The block lock data in that data byte is stored in BIT2 of that register.

BIT2 of each of registers 30a–31f generates one of block lock signals BS0 through BS31 to block lock circuit 32 via a multiplexer 72. Each of the block lock signals BS0–BS31 is used by block lock circuit 32 to lock the respective one of the blocks of memory array 31. Which one of the BS0–BS31 signals is applied to become the block lock BL signal depends on the selection of multiplexer 72. Multiplexer 72 receives the addresses (i.e., block addresses) to selectively couple one of the BS0–BS31 signals to block lock circuit 32. When activated by the $\overline{WP}$ signal, block lock circuit 32 passes the block lock signal BL to command and write state circuitry 40 to lock the respective blocks of memory array 31 for the programming and erasure operations.

Figure 4:
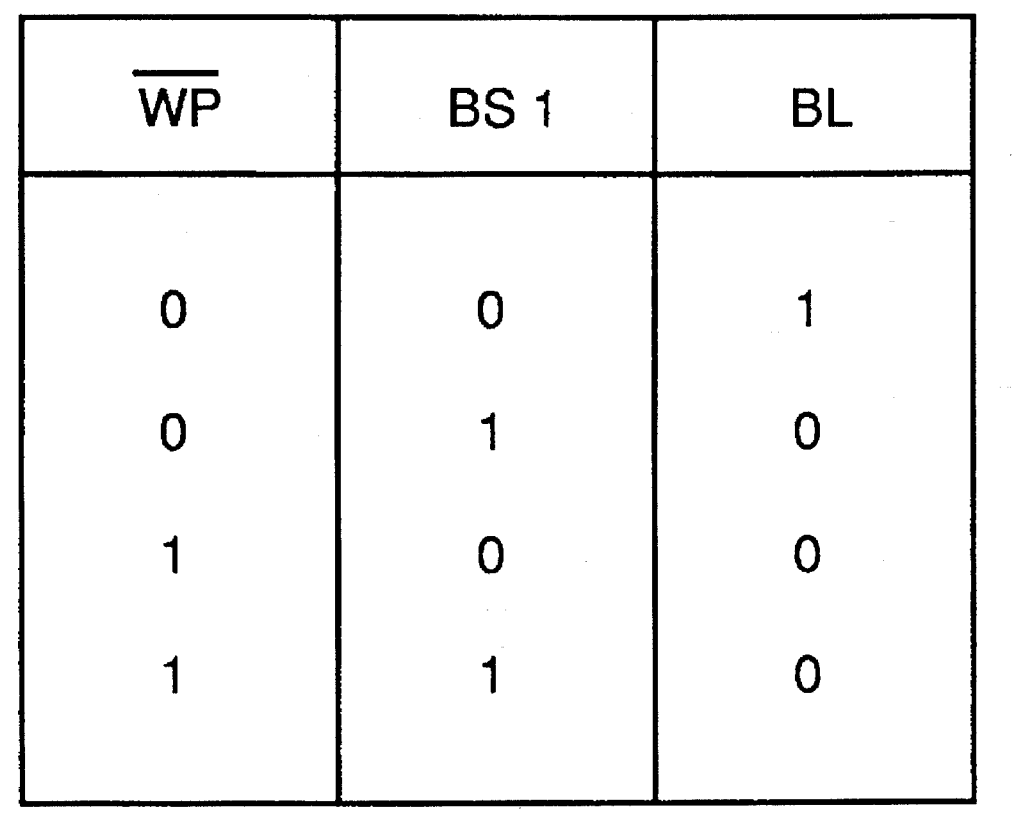

Block lock circuit 32 includes a NOR gate 73 having an input coupled to receive one of the block lock signals BS0 through BS31 via multiplexer 72. NOR gate 73 has its other input coupled to receive the $\overline{WP}$ control signal. NOR gate 73 outputs the BL block lock signal. The BL block lock signal is applied to command and write state circuitry 40 via bus 35. The BL block lock signal is the complementary signal of the selected one of the BS0 through BS31 block lock signals when the $\overline{WP}$ control signal applied to block lock circuit 32 is logically low. The BL block lock signal is forced to be logically inactive low when the $\overline{WP}$ control signal is logically high. FIG. 4 illustrates, as an example, the relationship of the $\overline{WP}$, BS1, and BL signals in a truth table.

Referring to FIG. 4, as can be seen from the truth table, the BL signal is the complementary signal of the BS1 signal when the $\overline{WP}$ signal is logically low assuming multiplexer 72 selects the BS1 signal. This means that NOR gate 73 of FIG. 3 is enabled by the logical low $\overline{WP}$ control signal at this time. When the $\overline{WP}$ signal goes to logical high state, the BS1 signal is negated and the BL signal becomes logically inactive low. At this time, the respective block of memory array 31 (FIGS. 2–3) is not locked.

Referring now to FIGS. 2–4, whenever flash EPROM 20 is powered on, the contents in block status registers 30 are reset to logical low. This means that the block status registers 30 are defaulted to store the block lock data for all the blocks of memory array 31. This means that all the blocks of memory array 31 are required to be locked from being accessed by command and write state circuitry 40 for the programming and erasure operations. Whether the blocks of memory array 31 are actually locked for the programming and erasure operations now depend on the $\overline{WP}$ control signal applied to the $\overline{WP}$ pin of flash EPROM 40 as the $\overline{WP}$ control signal is the master write protection signal.

If the $\overline{WP}$ control signal is logically inactive high, block lock circuit 32 ignores all the block lock data stored in block status registers 30 and memory array 31 and spare rows 41 are not locked and can be accessed during the programming and erasure operations. If the $\overline{WP}$ control signal is logically active low, block lock circuit 32 is enabled by the logical low $\overline{WP}$ signal to lock the individual blocks of memory array 31 in accordance with the block lock data stored in block status registers 30. Since block status registers 30 are now defaulted to store the block lock data for all the blocks of memory array 31, block lock circuit 32 locks command and write state circuitry 40 from accessing the entire memory array 31 and spare rows 41 for the programming and erasure operations. When flash EPROM 40 is powered up, block status registers 30 are defaulted to store the block lock data for all the blocks of memory array 31 no matter whether spare rows 41 store the block lock data for the individual blocks of memory array 30 or not. At this time, spare rows 41 may not store the block lock data for some of the memory blocks of memory array 31.

In order to update block status registers 30 with the block lock data stored in spare rows 41, the external circuitry applies a special command to command and write state circuitry 40 to read the data stored in spare rows 41. Command and write state circuitry 40 then accesses each of spare rows 41 to read the block lock data of each of the blocks of memory array 31. The block lock data of each of the blocks is then stored in the corresponding register of block status register 30. For example, when the row of SPAREROW 0 for BLOCK 0 does not store the block lock data and SPAREROW 1 for BLOCK 1 stores the block lock data, command and write state circuitry 40 updates block status register 30 in accordance with this information and the block lock data stored in BIT2 of register 30a is changed to indicate BLOCK 0 is not locked. Meanwhile, the block lock data in BIT2 of register 30b is unchanged.

Before command and write state circuitry 40 reads each of spare rows 41 to update the block lock data stored in block status registers 30, command and write state circuitry 40 first checks the existence of the data valid flag data in each of spare rows 41 to determine if the block lock data stored in the respective spare rows 41 are valid data or not. If, for example, command and write state circuitry 40 does not find the data valid flag data in SPARE ROW 0, the data stored in that row is regarded as invalid and cannot be used to update register 30a of block status register 30.

The block locked data for a particular block is written into the associated spare row of spare rows 41 by command and write state circuitry 40 during the programming operation. The external circuitry can issue a special command to command and write state circuitry 40 to write the block lock data into the corresponding row of spare rows. For example, when BLOCK 0 of memory array 31 needs to be locked from being accessed for the programming and erasure operations and the block lock data is not stored in SPARE ROW 0, the external circuitry applies a "LOCK BLOCK 0" command to command and write state circuitry 40. Command and write state circuitry 40 then writes the block lock data into SPARE ROW 0.

To unlock a locked block of memory array 31, the $\overline{WP}$ control signal is made logically high and the block and its associated spare row is erased. When the $\overline{WP}$ control signal is logical high, all the locked blocks of memory array 31 can be accessed for the programming and erasure operations even though the block lock data is stored in their respective rows of spare rows. At this time, the block lock data for a particular locked block can be erased by the block erasure operation of that block. A locked block can undergo the programming and erasure operations only when the $\overline{WP}$ signal is at logical high state.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device, comprising:

(A) a first nonvolatile memory cell that is adjacent to and corresponds to a first block of a nonvolatile memory array, wherein the first nonvolatile memory cell stores a first datum indicating the first block is locked;

(B) a first register that receives and stores the first datum when a read operation is performed on the first nonvolatile memory cell, wherein the first register does not decode the first datum;

(C) a second nonvolatile memory cell that is adjacent to and corresponds to a second block of the nonvolatile memory array, wherein the second nonvolatile memory cell stores a second datum indicating that the second block is locked;

(D) a second register that receives and stores the second datum when the read operation is performed on the second nonvolatile memory cell, wherein the second register does not decode the second datum; and (E) block lock circuitry that provides a block lock signal to a control circuit upon receiving an enable signal, the enable signal comprising the first datum from the first register when the first block is addressed and the second datum from the second register when the second block is addressed, and wherein when the block lock signal is received by the control circuit, the control circuit prevents programming and erasure of the respective one of the first and second blocks that is addressed.

2. The memory device of claim 1, wherein the block lock circuitry further receives a write control signal such that when the write control signal is deasserted the block lock circuitry is prevented from providing the block lock signal to the control circuit.

3. The memory device of claim 2, wherein the write control signal is coupled to an input pin of the memory device such that the write control signal is asserted and deasserted by an external user of the memory device.

4. The memory device of claim 1, wherein the first nonvolatile memory cell is locked when the first block is locked and the second nonvolatile memory cell is locked when the second block is locked.

5. The memory device of claim 1, wherein the block lock circuit further comprises a NOR gate.

6. The memory device of claim 1, wherein the first and second registers receive the first and second data upon an initiation of power to the memory device.

* * * * *